US008283681B2

(12) United States Patent
Sakamoto et al.

(10) Patent No.: US 8,283,681 B2
(45) Date of Patent: Oct. 9, 2012

(54) LIGHTING DEVICE AND METHOD OF MANUFACTURING THE SAME

(75) Inventors: Noriaki Sakamoto, Midori (JP); Naoki Tanahashi, Osaka (JP); Tsuyoshi Hasegawa, Daito (JP); Takaya Kusabe, Ota (JP); Masahiko Mizutani, Ota (JP); Hideki Mizuhara, Ichinomiya (JP); Yoshinari Sakuma, Niigata (JP)

(73) Assignees: SANYO Electric Co., Ltd., Moriguchi-shi (JP); SANYO Semiconductor Co., Ltd., Gunma (JP)

( * ) Notice: Subject to any disclaimer, the term of this patent is extended or adjusted under 35 U.S.C. 154(b) by 89 days.

(21) Appl. No.: 12/905,855

(22) Filed: Oct. 15, 2010

(65) Prior Publication Data

US 2011/0241025 A1 Oct. 6, 2011

(30) Foreign Application Priority Data

Mar. 30, 2010 (JP) .................................. 2010-77686
Mar. 30, 2010 (JP) .................................. 2010-77687

(51) Int. Cl.
*H01L 29/18* (2006.01)

(52) U.S. Cl. ................... 257/88; 257/E33.056

(58) Field of Classification Search .................... 257/88, 257/98, 116, 660, 678, 700, 730, E33.056, 257/E33.057
See application file for complete search history.

(56) References Cited

U.S. PATENT DOCUMENTS

| 7,808,013 | B2* | 10/2010 | Mendendorp et al. | .......... 257/99 |
| 2005/0133698 | A1* | 6/2005 | Oniki et al. | .................... 250/216 |
| 2007/0057364 | A1* | 3/2007 | Wang et al. | .................... 257/701 |
| 2007/0080360 | A1* | 4/2007 | Mirsky et al. | .................... 257/99 |
| 2009/0152570 | A1* | 6/2009 | Wang et al. | .................... 257/88 |
| 2009/0278162 | A1* | 11/2009 | Wang et al. | .................... 257/99 |
| 2010/0109039 | A1* | 5/2010 | Kim | ................................ 257/98 |
| 2011/0024785 | A1* | 2/2011 | Ng et al. | .......................... 257/99 |
| 2011/0157891 | A1* | 6/2011 | Davis et al. | .................... 362/244 |
| 2012/0009700 | A1* | 1/2012 | Wang et al. | ..................... 438/27 |

FOREIGN PATENT DOCUMENTS

JP 2001-203395 7/2001

* cited by examiner

*Primary Examiner* — Michelle Mandala
*Assistant Examiner* — Vongsavanh Sengdara
(74) *Attorney, Agent, or Firm* — Morrison & Foerster LLP

(57) ABSTRACT

A lighting device including a metal substrate to prevent temperature rise of LED chip is offered. The lighting device includes the metal substrate, an anode or cathode electrode of the LED chip disposed on the metal substrate, brazing materials connecting the LED chip and the metal substrate, and a groove formed in the anode or cathode electrode. Forming the groove can prevent an occurrence of a crack in the brazing materials.

Also, a lighting device includes the metal substrate, an anode and cathode electrode of the LED chip disposed on the metal substrate and brazing materials connecting the LED chip and the metal substrate. Further, a slit is formed in the metal substrate between the anode and cathode electrode. Forming the slit in the metal substrate can prevent an occurrence of a crack in the brazing materials.

9 Claims, 16 Drawing Sheets

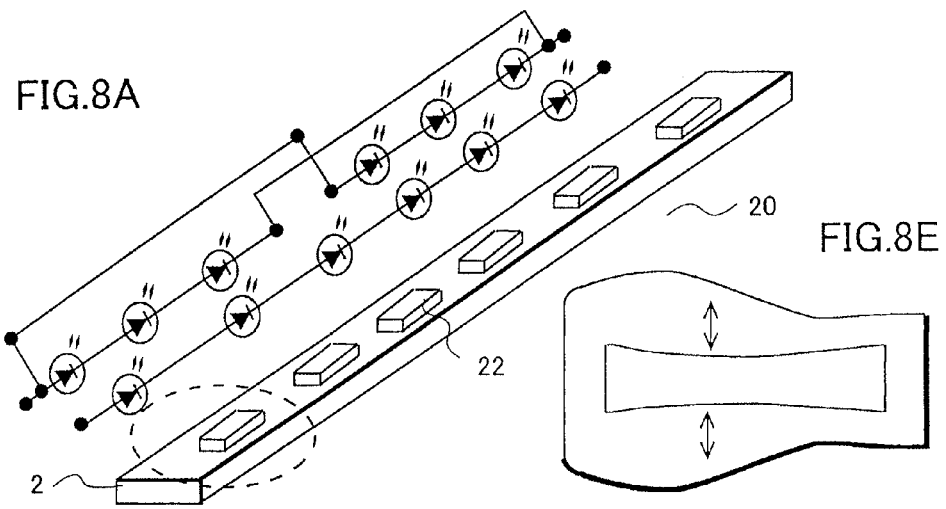
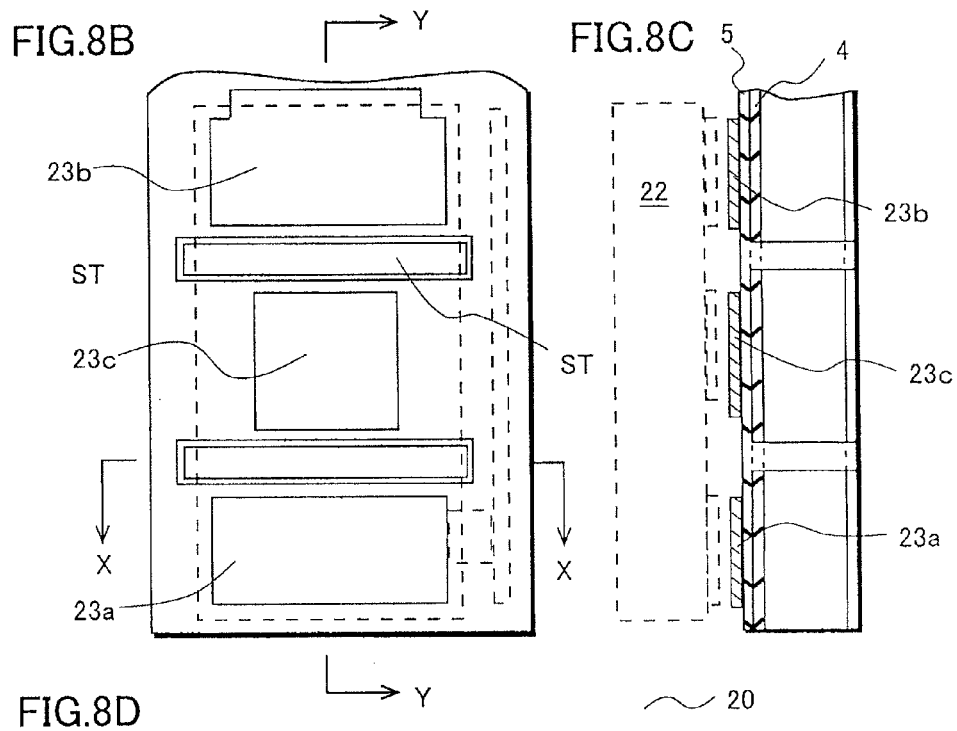

FIG.10A
FIG.10B
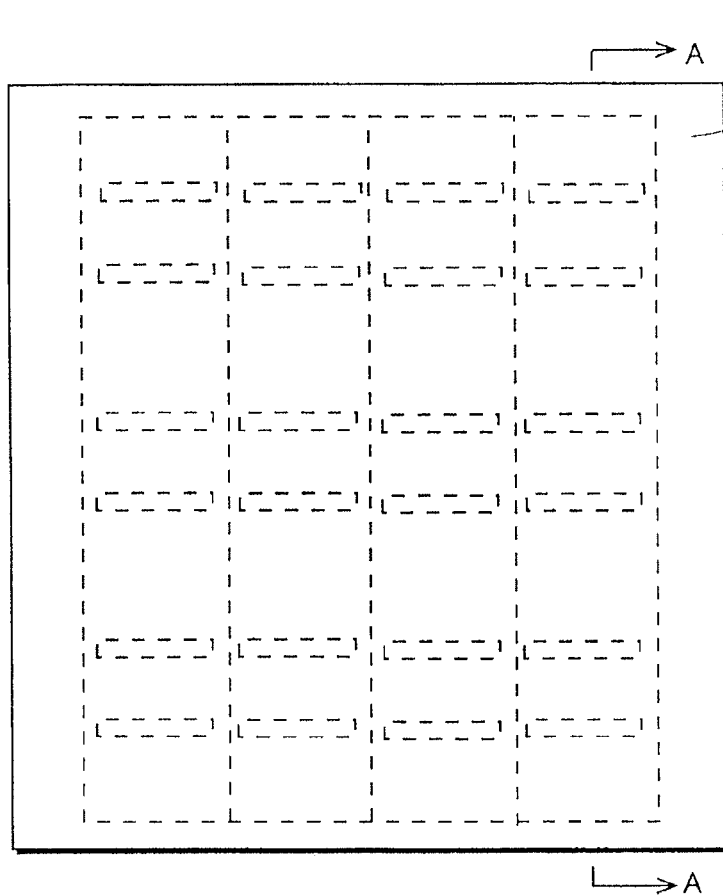
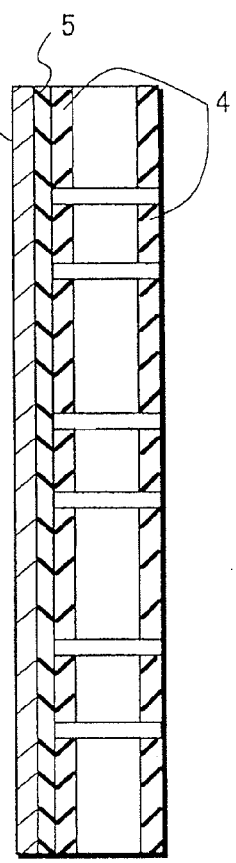

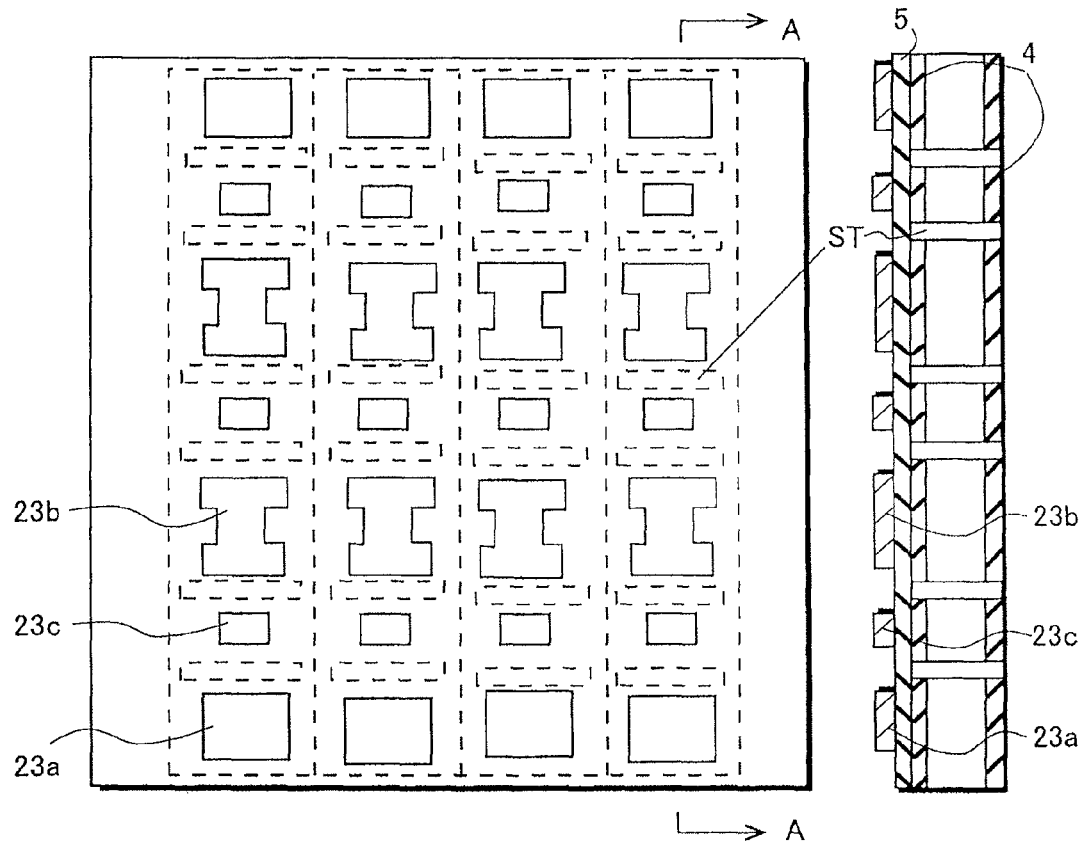

FIG.14A
FIG.14B
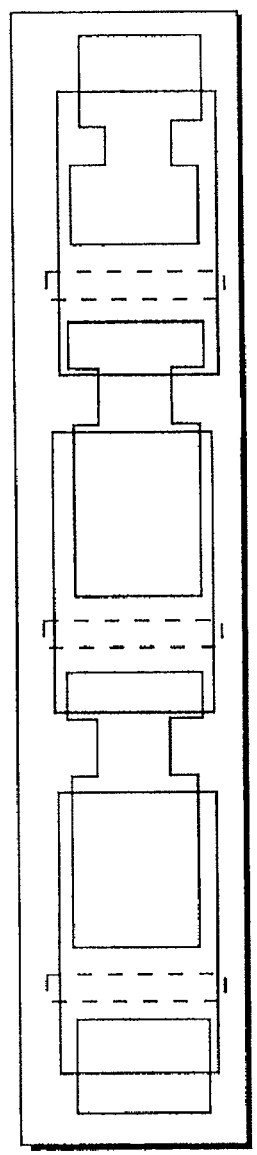
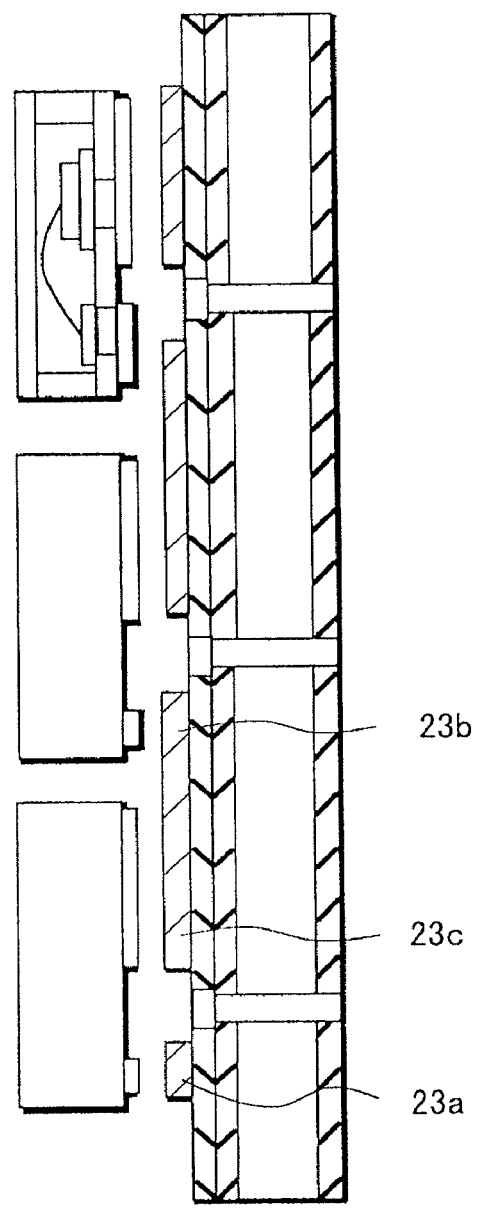
20
23b
23c
23a

LIGHTING DEVICE AND METHOD OF MANUFACTURING THE SAME

BACKGROUND OF THE INVENTION

1. Field of the Invention

The present invention relates to a lighting device which light-emitting diodes (LED) are mounted in rows, and a manufacturing method of a substrate for lighting device.

2. Description of the Related Art

In recent years, a prevention of global warming is called out, and many countermeasures are taken in the world. Among them, specifically, each company advance the development of a technology to generate energy such as solar battery and wind-power generation, to store energy such as fuel battery and to save energy such as inverter using energy with high efficiency as the technology preventing carbon dioxide evolution.

As one of the technology to save energy, LED is pushed into the spotlight because LED can be drove with quite electrical power saving compared to filament lamp and fluorescent light. Thus, LED is used as backlight of larger-screen LCD TV, lighting for home use and car headlights.

However, this LED has a problem in terms of temperature characteristic. For example, this problem is shown in FIG. 5 of JP-A-2001-203395.

According to the explanation of the above art, as shown in FIG. 16, LED has characteristics that an amount of light does not increase, but decrease even if driving current is increased once surface temperature of LED chip (operating range of temperature) become above from about 80 to 90 degrees C.

A bottom curve shows a change of current versus surface temperature on Al substrate, a curve plotted by the middle triangles shows a change of current versus surface temperature on PCB substrate, and a curve having a peak upward shows a change of current versus amount of light of LED. Because the curve of the amount of light has a peak, it seems difficult to increase the amount of light of LED without reducing the temperature of LED as much as possible and making the amount of light increase against driving current. In case that a printed substrate as a mounting substrate of LED is employed, a surface temperature of printed substrate rises 230 degrees C. at a time, and the amount of light does not increase even if a large amount of current is applied to LED because a coefficient of thermal conductivity of printed substrate is small. However, if a metal substrate is employed, it can keep the surface temperature of LED at about 85 degrees C. because a coefficient of thermal conductivity of metal substrate is large. This means that a metal substrate effectively works as a heat sink and radiator plate, and the surface temperature of LED is decreased, and it is possible to increase driving current and simultaneously to expand the amount of light by the decrease in the surface temperature. As just described, in order to realize decrease in surface temperature of LED, the heat given off from LED has to be released outside as much as possible in some way.

Although a metal such as Al or Cu, a metal alloy and a ceramic such as aluminum oxide or AlN are nominated as a mounting substrate having superior radiation performance, Al which is lighter in weight attracts attention from ecological thinking. Al is a little inferior in coefficient of thermal conductivity compared to Cu, but it is the most important point that Al is cheaper and lighter in weight.

However, the metal substrate has a problem which relates to heat expansion coefficient. Some concrete numerical values are shown below.

Al: 23-25 ppm/degrees C.
Semiconductor element: 3.5 ppm/degrees C.
Chip resistor: 7.0 ppm/degrees C.
Chip condenser: 10.0 ppm/degrees C.
Solder: 23 ppm/degrees C.

By mounting LED on a metal substrate, it is possible to release a heat given off from LED, but it becomes overloaded with the weakest portion because of the difference in heat expansion coefficient between Al and LED as can be expected from the data.

FIG. 15, for example, shows a principle and a state that a chip element is mounted on a metal substrate. Arrows described in FIG. 15 indicate heat expansion coefficient, or expansion and contraction to temperature. Since an expansion of the metal substrate is larger, it burdens the solder, and thereby the acuter an angle between a side surface of the solder and a back side surface of the element is, the larger a load of portion illustrated by circle becomes.

In particular, LED package that LED is encapsulated in ceramic package or that LED mounted on lead frame is sealed with resin is mounted on the substrate through the solder in tentis of mounting technology, but the solder is burdened with large load due to large heat expansion coefficient in the Al substrate. In early times, the solder withstands the load. However, as thermal cycle number applied to the solder is growing with the clock ticking away, finally, a solder crack occurs and a circuit remains open, so that there is a possibility that LED becomes nonluminescent. Although the lead frame can absorb the stress applied to it by flexibility of the lead, in case of encapsulating LED in the ceramic substrate, because the structure that an electrode is deposited on the back surface of the ceramic substrate is generally employed, the solder disposed on the back surface of the electrode is burdened with load and the solder crack may be induced.

SUMMARY OF THE INVENTION

The invention provides a lighting device that includes a metal substrate comprising aluminum, and a plurality of LED packages mounted on a top surface of the metal substrate. Each package includes a ceramic substrate, a LED chip mounted on a front surface of the ceramic substrate, an anode electrode, a cathode electrode and a heat release electrode. The anode, cathode and heat release electrodes are disposed on a back surface of the ceramic substrate. The lighting device further includes aresin insulation film disposed on the top surface of the metal substrate so as to be between the LED packages and the top surface, a first electrode, a second electrode and a third electrode which are disposed on the insulation film. The first, second and third electrodes are bonded by brazing to the anode, cathode and heat release electrodes, respectively.

The invention also provides a lighting device including a metal substrate comprising aluminum, and a plurality of LED packages mounted on a top surface of the metal substrate. Each package includes a ceramic substrate, a LED chip mounted on a front surface of the ceramic substrate, an anode electrode and a cathode electrode. The anode and cathode electrodes are disposed on a back surface of the ceramic substrate. The lighting device further includes a resin insulation film disposed on the top surface of the metal substrate so as to be between the LED packages and the top surface, and a first electrode and a second electrode which are disposed on the insulation film. The first and second electrodes are bonded by brazing to the anode and cathode electrodes, respectively, and a slit is formed in the metal substrate between two neighboring anode and cathode electrodes.

The invention also provides a manufacturing method of a substrate on which an LED package having an anode electrode and a cathode electrode is mounted. The method includes providing a metal substrate, forming a slit between regions of the metal substrate corresponding to locations of the anode electrode and the cathode electrode that are disposed on the metal substrate, applying a copper foil to a surface of the metal substrate through an resin film, and patterning the copper foil so as to form the anode electrode and the cathode electrode.

BRIEF DESCRIPTION OF THE DRAWINGS

FIG. 8 is a view illustrating a lighting device.
FIG. 10 is a view illustrating a method for manufacturing a lighting device.
FIG. 11 is a view illustrating a method for manufacturing a lighting device.
FIG. 14 is a view illustrating a lighting device.

DETAILED DESCRIPTION OF THE INVENTION

Figure 1A:
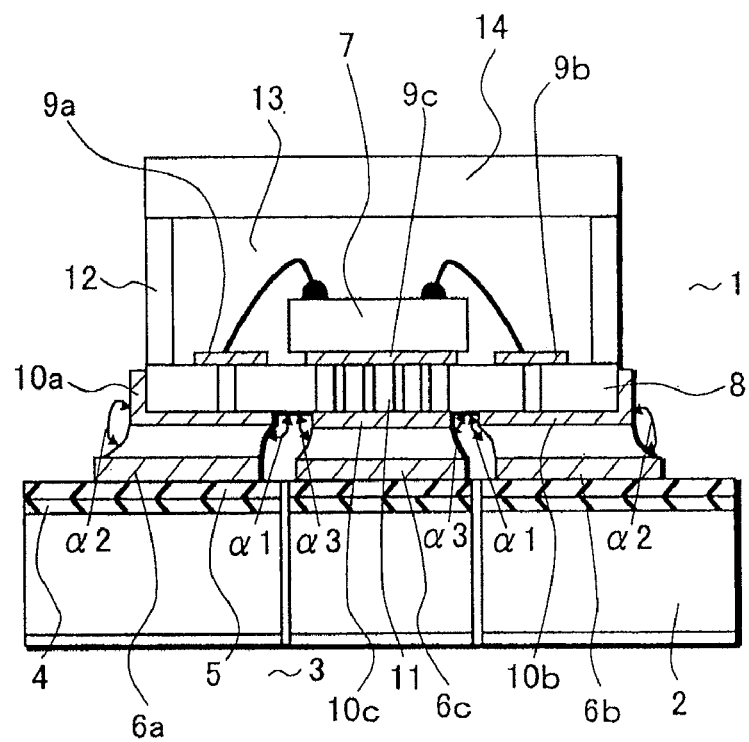
FIG. 1 is a view illustrating a lighting device.

Embodiments of the invention will be described with reference to the accompanying drawings. FIG. 1(A) shows a technology regarding to LED module 3 that LED package 1 encapsulating LED chip 7 is mounted on a metal substrate 2.

Specifically, as the material of the metal substrate 2, metal alloy such as consisting primarily of Cu or Al may be used. But, in view of being equipped with a car and LCDTV, the metal substrate 2 consisting of Al or consisting primarily of Al for its lightness will be described. This Al substrate 2 is no less than 1.0 mm, no more than 2.0 mm thick (for example 1.5 mm) and both of principal surface are covered by inorganic insulation film (alumite film) 4 consisting primarily of aluminous oxide film. Moreover, top surface of the substrate 2 is entirely covered by an insulation film 5 consisting of resign which is mixed with filler and conductive pattern 6 is formed on the top surface of the insulation film 5. In addition, the inorganic insulation film may be passed over. Of course, the insulation film 5 itself has a large thermal resistance, but the thermal resistance can be reduced by a fill ration of filler.

Next, LED package 1 will be explained. A bear chip of LED 7 is mounted on a surface of a ceramic substrate 8. Because of mounting the bear chip, conductive patterns 9a-9c is disposed on a front surface of the ceramic substrate 8, and other conductive patterns 10a-10c is correspondingly disposed on a back surface of the ceramic substrate 8. Here, the conductive patterns 9a and 10a is anode (or cathode) electrode of LED (hereafter referred to as A electrode), and the conductive patterns 9b and 10b is cathode (or anode) electrode of LED (hereafter referred to as C electrode), and each conductive patterns 9a and 10a, and 9b and 10b is electrically connected through a through-hole via. Moreover, an island 9c, which is thermally connected to a rear face of the bear chip, is thermally connected to a heat release electrode 10c (hereafter referred to as Rd electrode) which is disposed on the back surface of the ceramic substrate 8 through a thermal via 11. This thermal via 11 is formed by baking the metal paste having high heat thermal conductivity, and Ag or Cu is employed as the thermal via 11.

In addition, in terms of a reduction of method for manufacturing, it will be preferred that a material of the thermal via 11 as is same as the through-hole via. Also, the electrodes 10a and 10b extend upward from the back surface of the ceramic substrate 8 along the side surface. In sectional view, these electrodes have a configuration that L-shaped structure lay along.

Frame body 12 which forms four side surfaces of LED package 1 is disposed on a peripheral region of the ceramic substrate 8 and an inside of the frame body 12 works as a cavity 13 for the bare chip 7. Moreover, in terms of a seal performance of the cavity 13 and a permeability of light from LED, a light transmissive cap body 14 is adhered on a top surface of the frame body 12 through adhesive material.

In this embodiment, since a heat given off from the bare chip 7 is released to the metal substrate 2 via the thermal via 11, a rise in temperature can be reduced and a driving current can be raised. Moreover, as shown in FIG. 7, in LED bar, since LED package 1 is mounted over ten pieces, a whole temperature of LED module 3 increase necessarily. However, because the metal substrate 2 which works as heat sink or radiator plate is employed, a defect due to a rise in temperature can be reduced. In particular, if a under fill is formed, a peripheral region of a solder can be covered by resin and a compressive stress can be constantly applied to the solder. Epoxide resin or the one comprising filler are more desirable than a soft resin such as silicon because compressive stress works at a portion of the solder receiving stress.

Moreover, in regard to patterns of the rear electrode 10a, 10b and Rd electrode 10c, a structure which sacrifices the solder on Rd electrode 10c is employed. That is, the electrode 6a, 6b are conductive patterns formed on the metal substrate 2 and the anode electrode and cathode electrode 10a, 10b is correspondently adhered on the conductive patterns through brazing (brazing materials). In a similar way, the electrode 6c is a conductive pattern formed on the metal substrate 2 and is adhered on the Rd electrode 10c which is disposed on the back surface of the ceramic substrate 8 through the brazing materials. Such a structure which generates a crack in the solder of the heat release electrode 10c is employed, and as a result, the stress applied to the solder on the electrode 10a, 10b can be released and a generation of crack can be reduced.

Specifically, it will be described with an angle between side surface of the solder and the rear face of the metal substrate 2. First, some definitions are given with using FIG. 1(B).

Figure 1B:
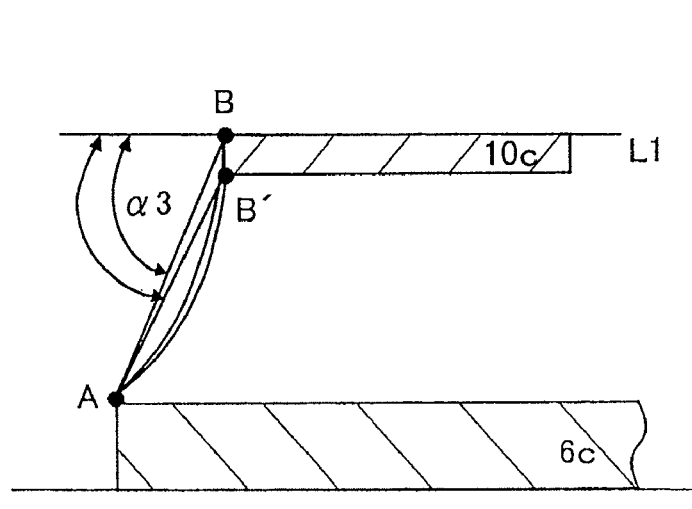

A surface where a solder melts is generally sweeping. For instance, the solder's condition of the heat release electrode 10c and the electrode 6c in the side of the metal substrate shown in FIG. 1(A) is indicated by FIG. 1(B). A line L1 shows a back surface of the ceramic substrate 8 and a line L2 shows a top surface of the metal substrate 2. And there is the Rd electrode 10c on the side of the ceramic substrate 8 and the electrode 6c on the side of the metal substrate 2. The solders are wetted between two substrates, and each electrode is electrically connected.

Here, although the angle between side surface of the solder and the rear face of the metal substrate 2 is discussed, the angle is defined as below. It will be considered whether, in a case of regarding a point B' of the heat release electrode 10c as starting point and a point A of the electrode 6c on the metal substrate as ending point, the solder is wetted with curving between the two points or, in a case of regarding a point B where an outer circumference contacts to the ceramic substrate as starting point, the solder is wetted with curving between the point B and A. The former side surface of the solder is regarded as straight line A-B' and the latter one as straight line A-B. Since the solder curves at either of the position between the two straight lines, the angle between these two straight lines and a horizontal line collectively means $\alpha 3$. This $\alpha 3$ is shown in FIG. 1(A) and because two $\alpha 3$ described at both sides of the heat release electrode 10c are substantially symmetry, the two $\alpha 3$ are defined as the substantial same one. In a similar manner, an angle between an inner side surface of the solder on the anode electrode and cathode electrode and horizontal surface is regarded as $\alpha 1$. On the other hand, an angle between a line L3 which is parallel to side wall of the ceramic substrate or the package and line A-B or A-B' collectively means $\alpha 2$.

Essentially, an obtuse angle is preferred as for these angle $\alpha 1$-$\alpha 3$. However, the electrode 6c is formed slightly larger than the heat release electrode 10c. And by forming the electrode 6c such that the electrode 6c includes the whole of the heat release electrode 10c in a plan view, $\alpha 3$ is made as acute angle.

The thermal cycle of LED module 3 constantly changes and the solder gets exhausted, and eventually the crack on the solder may happen although there are some differences in time. Therefore, in this case, the crack on the solder is made to happen at this part having the angle $\alpha 3$ so that the stress applied to the part of angle $\alpha 1$ and $\alpha 2$ will be released. In addition, as a path where a heat conducts from the heat release electrode downward, two paths exist. One is a path where a heat conducts directly underneath, and the other one is a path where a heat radiates like the skirt with an angle. Therefore, it is possible to radiate the heat more effectively because the electrode 6c on the side of the metal substrate is slightly larger than the heat release electrode 10c.

In this embodiment, although the ceramic package is explained, a resign package can be applicable to this embodiment if the resign package has the same structure.

Another embodiment of this invention will be explained below referring to FIG. 2 through FIG. 7. As shown in FIG. 7, this embodiment deals with LED bar which is fixed to the peripheral region of LCD TV and constituted as a part of a backlight, and the metal substrate 2 or LED package 1 is similar in construction to the former embodiment. The former embodiment is discussed about the angle of the side surface of the solder, but hereinafter a thickness of the solder will be discussed.

Figure 7A:
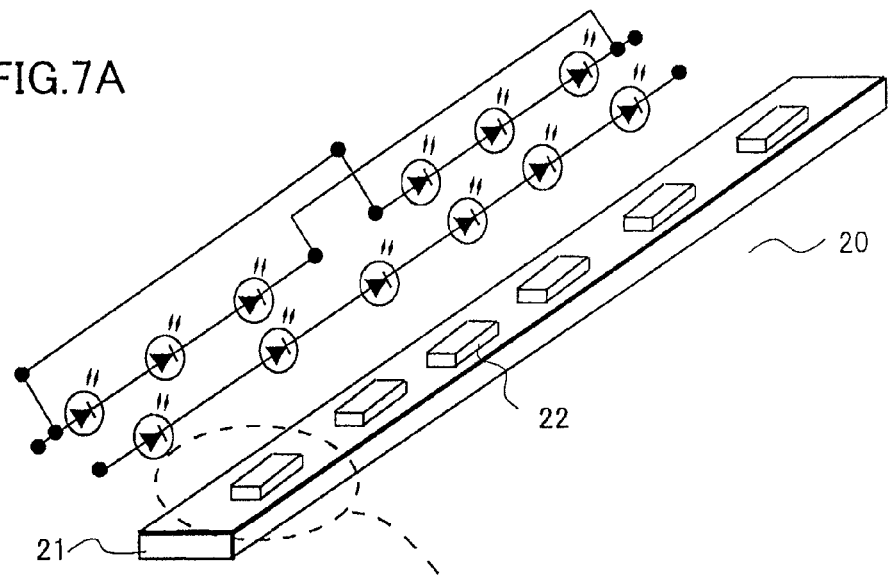
FIG. 7 is a view illustrating a lighting device.

As in the former embodiment, the metal substrate 2 consisting of Al or primarily of Al is employed as the substrate and has a thickness of from about 1.0 mm to about 2.0 mm and its planar size is 0.5 cm wide and 50.0 cm long. Although this length depends on TV size, in principle the substrate has an elongated shape as shown in FIG. 7(A). Also the width of LED bar, in principle, is similar to the thickness of a light guide plate and in recent years this thickness tends to be narrower from 0.5 mm with the thickness of LCD TV being thinner.

As shown in FIG. 7, LED packages 22 are disposed in a row on this elongated metal substrate 2. In particular, as shown in the below equivalence circuit of FIG. 7(A), LED packages are generally connected in series. In order to diffuse a growth from heat expansion coefficient, as in the above equivalence circuit of FIG. 7(A), some LED bars are used and they can be connected in parallel. The one LED bar comprises three LEDs connected in series, and these LED bars are connected in parallel. Although the LED bar has only three LEDs here, the number of LED is not limited. This parallel connection means a voltage applied to both end of the LED bar can be decreased, and even if some LED chips become a defective operation, the defective LED bar among those LED bars can be replaced.

Therefore, electrodes and wires corresponding to the equivalence circuit is formed on the metal substrate 2. In particular, as explained in FIG. 1(A), LED package 1 comprises the A electrode, the C electrode and the Rd electrode, and in FIG. 7(C) each sign 23a, 23b and 23c are correspond to them, and LED package itself is indicated by dotted line.

Figure 7B:
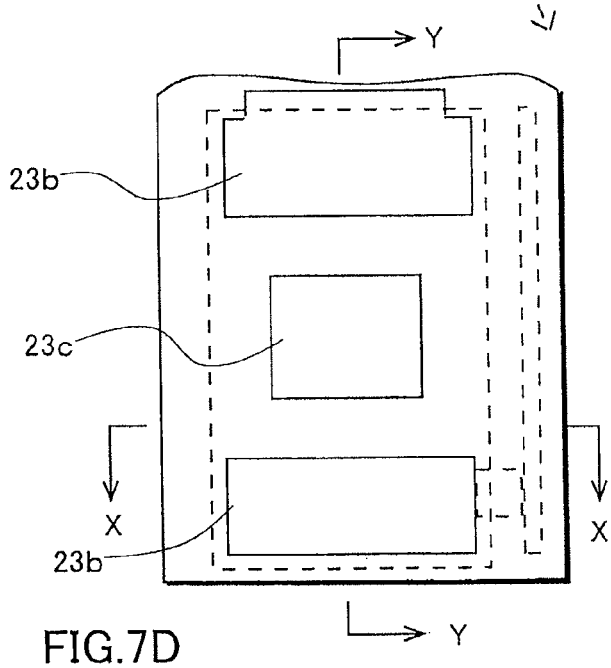
Figure 7C:
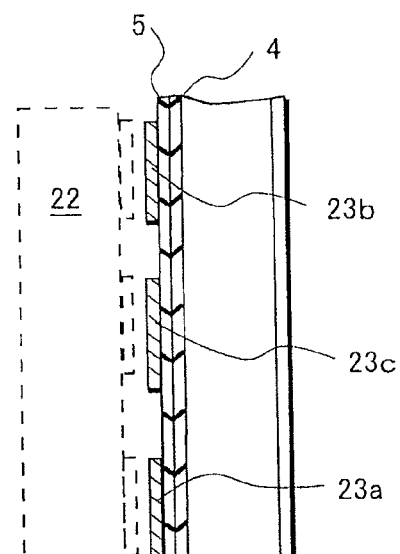
Figure 7D:
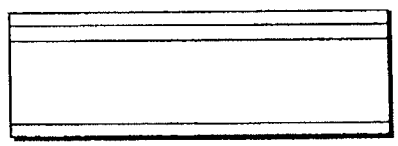

FIG. 7(B) is a drawing magnified a part of circle in FIG. 7(A) and depicts the conductive patterns disposed on the mounting region of one LED package. FIG. 7(C) is a cross-section drawing along the line X-Y and FIG. 7(D) is a cross-section drawing along the line X-X.

Figure 2A:
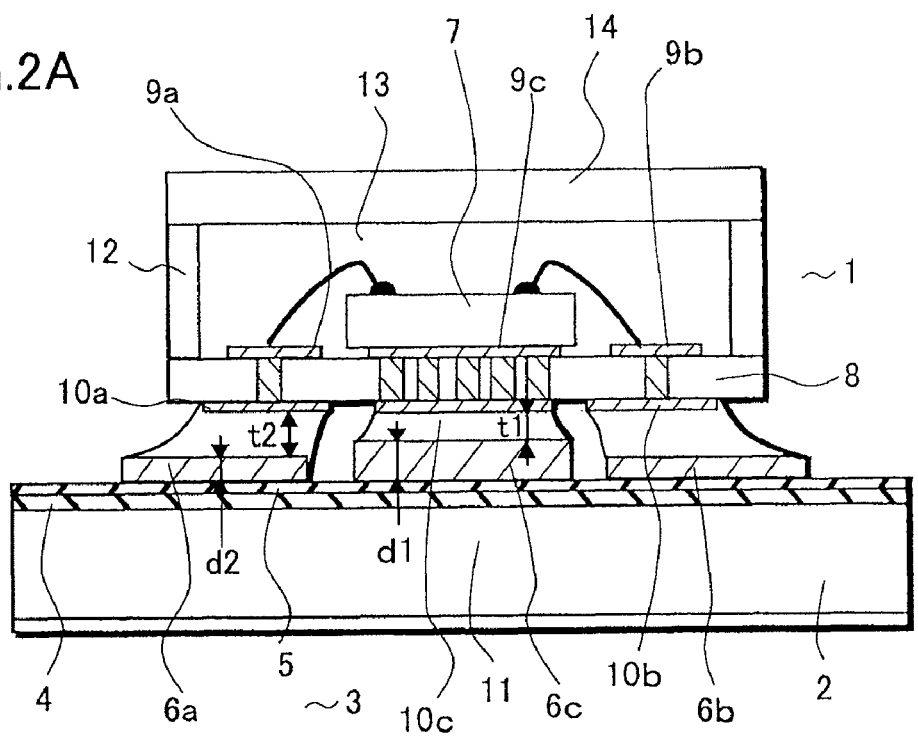
FIG. 2 is a view illustrating a lighting device.

The point of this embodiment is that the thickness of the conductive patterns 6a, 6b and 6c on the metal substrate 2 is controlled as shown in FIG. 2(A) (hereafter the conductive pattern 6a corresponding to the anode electrode is referred to as a first electrode, the conductive pattern 6b corresponding to the cathode electrode as a second electrode and the conductive pattern 6c corresponding to the heat release electrode as third electrode). When a thickness of the third electrode 6c is assumed as d1, a thickness of the first electrode 6a and the second electrode 6b are assumed as d2, a thickness of the brazing material between the Rd electrode 10c and the third electrode 6c as t1 and a thickness of the brazing material between A electrode 10a and the first electrode 6a, and between C electrode 10b and the second electrode 6b as t2, a relation of the thickness of the brazing material becomes t2>t1 because of d1>d2.

Since the thickness of the brazing material t2 functioning as an electrode is formed thickly, a strength of the brazing material can be improved. Furthermore, since the thickness t1 is thin, a stress tends to concentrate on the brazing material on the conductive pattern 6c, and the thin portion gets exhausted in first and the crack on the brazing material functioning as an electrical connection can be inhibited. Furthermore, if a periphery of the brazing material is covered by an underfill material etc, the crack can be inhibited because a compressive stress is constantly applied there. Also, since the compressive stress is applied to there, the brazing material can has a function for releasing heat without decoupling the thermal coupling even if the crack arise in the brazing material on the heat release electrode.

Figure 2B:
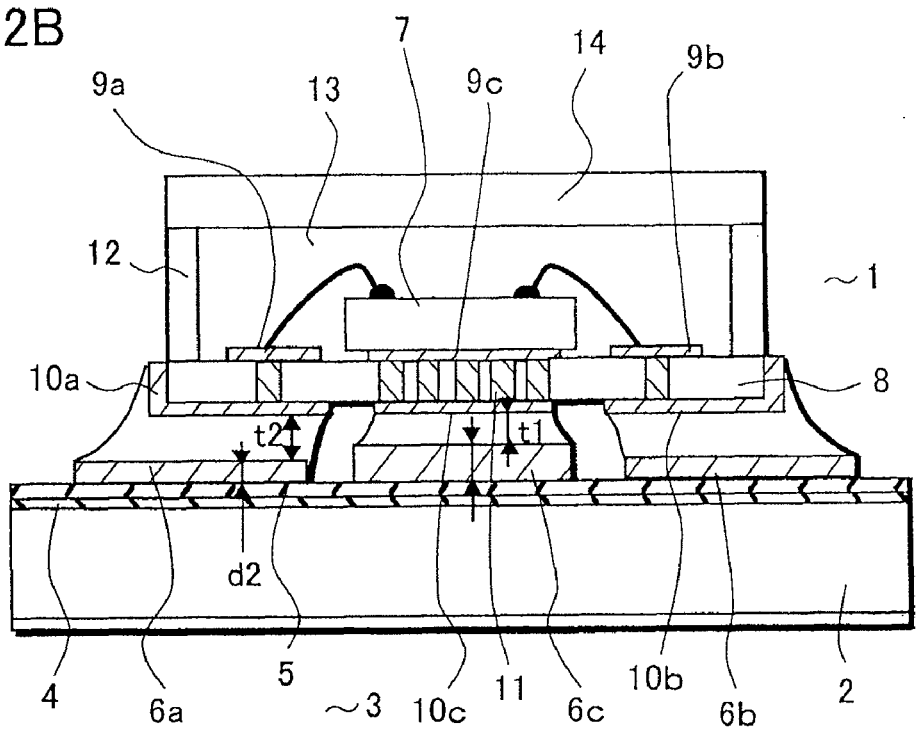

Next, FIG. 2(B) will be explained. A different part of FIG. 2(B) compared with FIG. 2(A) is that the A electrode 10a and the C electrode 10b extend on a side surface of the ceramic substrate 8. In other words, these electrodes extend a side surface of the LED package 1. The rest of FIG. 2(B) is same to FIG. 2(A). As explained in FIG. 1(A), since the angle $\alpha 2$ on the A electrode 10a and the C electrode 10b become obtuse angle, the strength of the brazing material will be improved.

The conductive patterns 6 disposed on the metal substrate 2 have uniformity thickness at an early phase of manufacturing process. A difference of the thickness between the first electrode (the second electrode) and the third electrode may be made by etching the first electrode and the second electrode. In contrast, the difference of the thickness may be made by attaching copper foil etc. on the third electrode.

Figure 3:
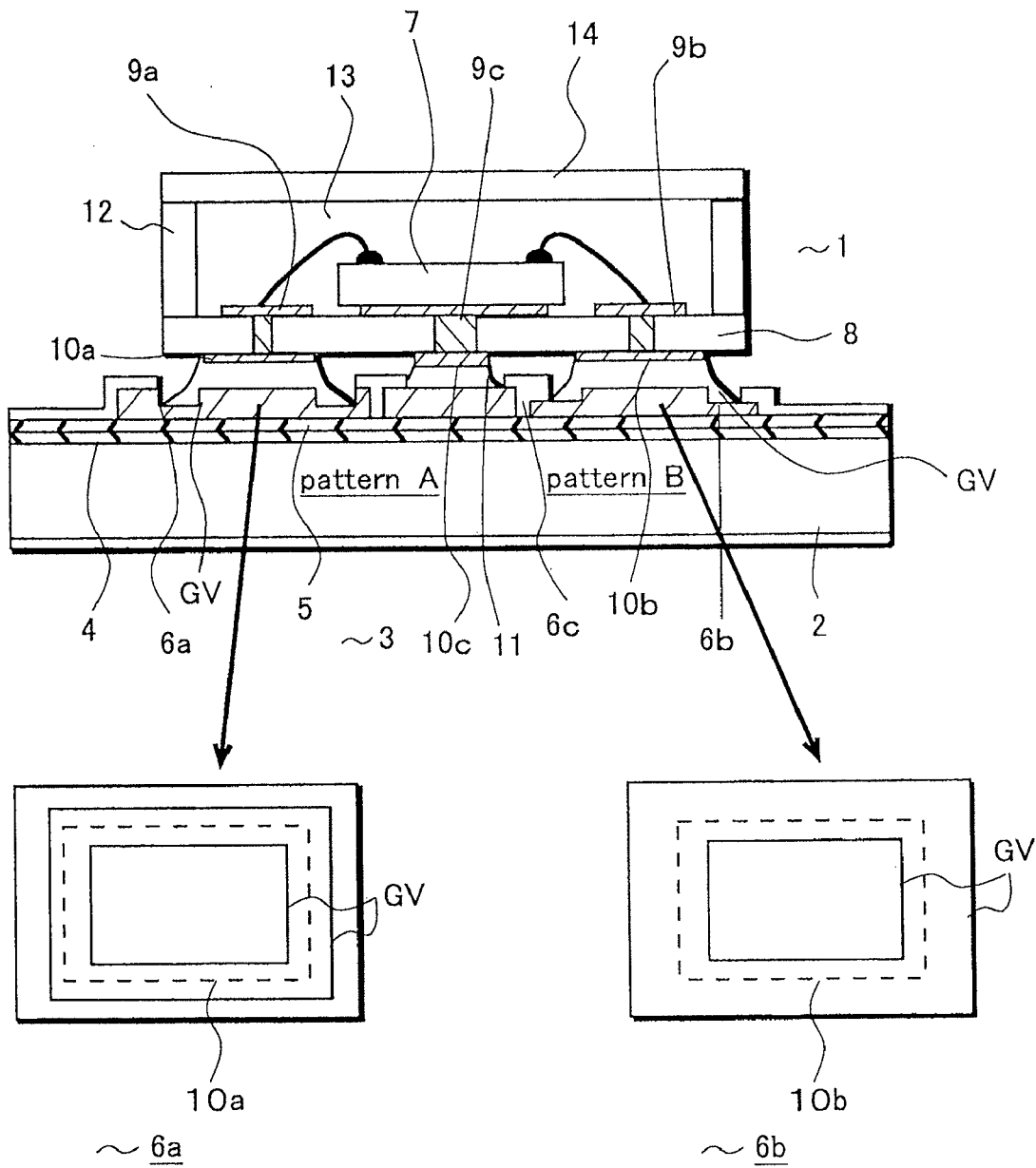
FIG. 3 is a view illustrating a lighting device.
Figure 4:
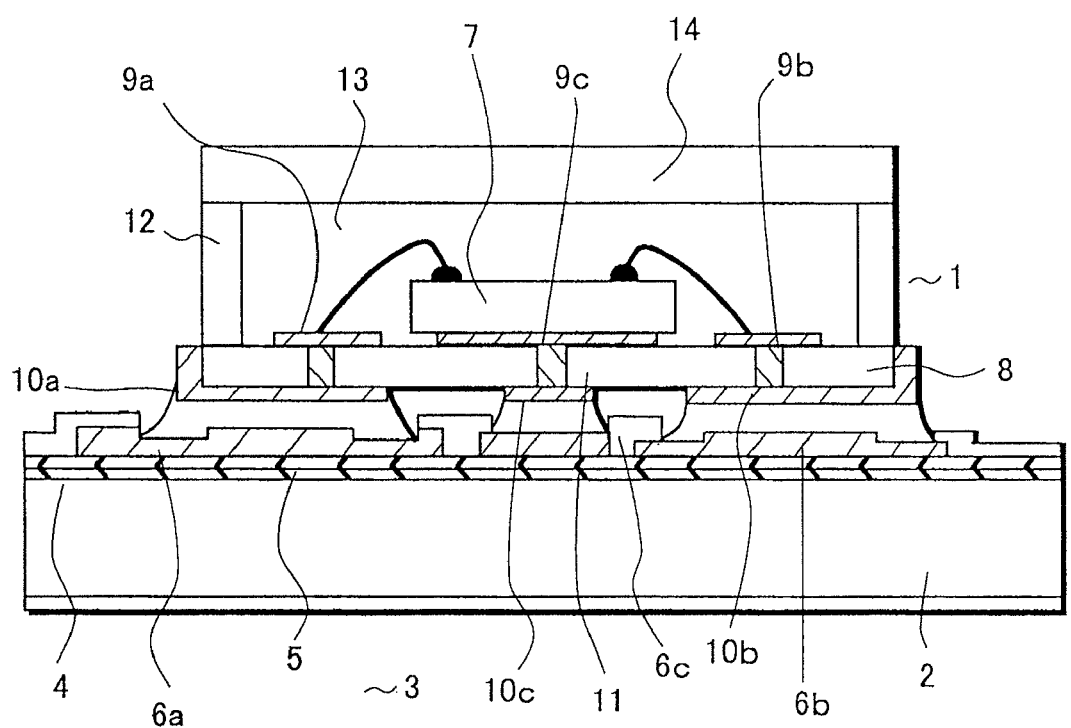
FIG. 4 is a view illustrating a lighting device.

FIGS. 3 and 4 will be explained. FIGS. 3 and 4 are same to FIGS. 2(A) and 2(B) except for a shape of the A electrode 6a and the C electrode 6b and only a different part will be explained.

FIG. 3 shows that a groove (GV) is formed in the first electrode 6a and the second electrode 6c with half-etching. Although two types are illustrated to right and left in FIG. 3, either practically can be chosen, and the right-left electrodes will have a same shape. The depth of the groove is shallower than the thickness of the electrode. In plain view of the first electrode 6a indicated by arrow, LED package 1 is illustrated with a dotted line. An outer side wall of the groove is located on outside of the LED package and inside of the electrode 6a, and the groove is formed such that the inner side wall of the groove is formed on inside of the LED package 1. Furthermore, if the electrode is covered with an insulating material such as a solder resist to the side wall or on the way of the groove, the outer side surface of the brazing material can be located in the groove. Thus, because the brazing material is wetted down the inner side wall of the first electrode 10a, the thickness of the brazing material becomes thick, so that the strength of the brazing material can be improved.

On the other hand, a groove shape in the C electrode does not have an outer side wall, and a groove of constant depth is formed from an inner side wall to an edge of the electrode. The thickness of the brazing material can be maximized and the exhaustion of the brazing material can be inhibited.

The structure of FIG. 4, compared to the structure of FIG. 3, shows that the A electrode 10a and the C electrode 10b extend to either the side wall of the ceramic substrate 8 or the side wall of the LED package. The angle α2 also becomes the obtuse angle and the reliability can be further improved.

Figure 5:
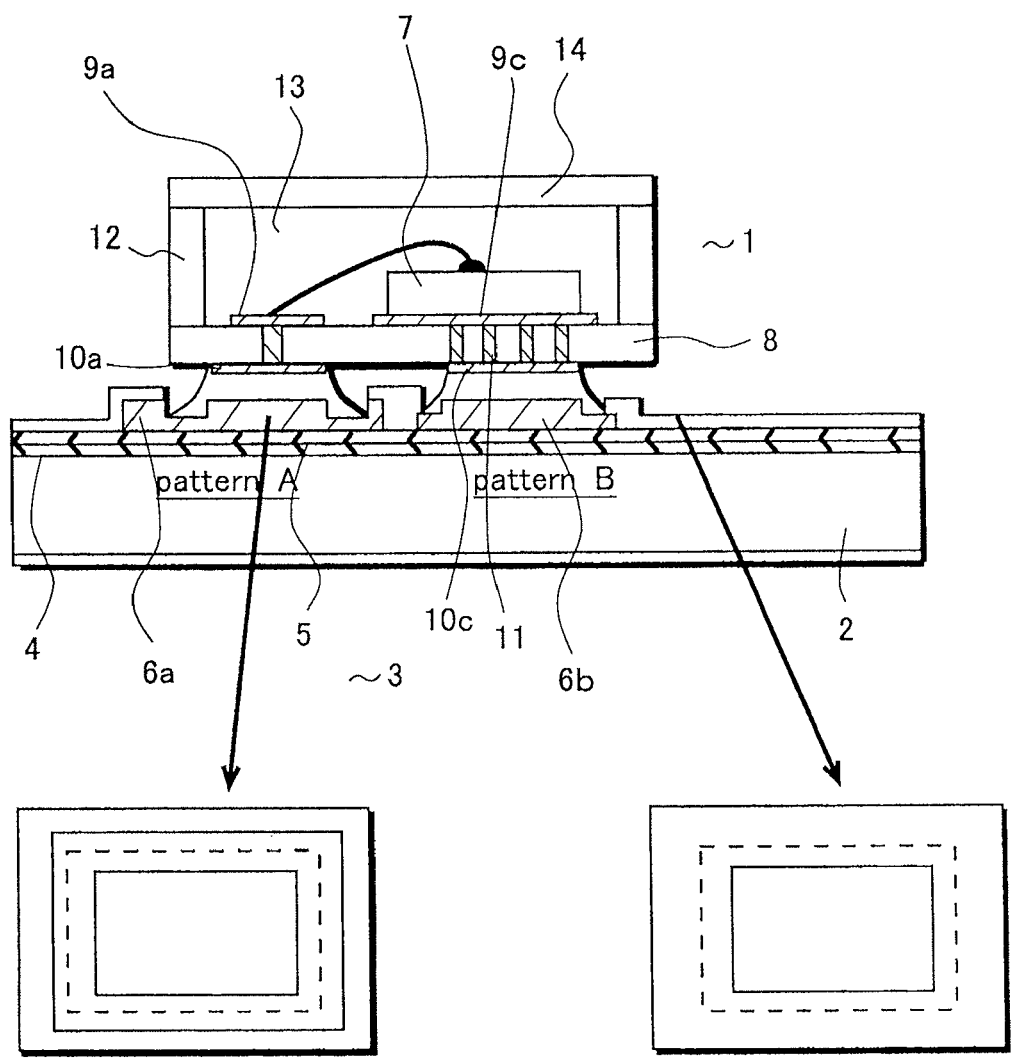
FIG. 5 is a view illustrating a lighting device.

The structure shown in FIG. 5 and FIG. 6 will be explained. In this case, the bare chip 7 mounted on LED package is different from the current chip. That is, a back surface of the LED chip works as the C electrode and the heat release element. Therefore, the bare chip 7 works only with two electrodes and the original heat release electrode can be deleted. The pattern of the A electrode and the C electrode disposed on the metal substrate is similar to the pattern shown in FIG. 3. Either pattern is still selected and formed.

Figure 6:
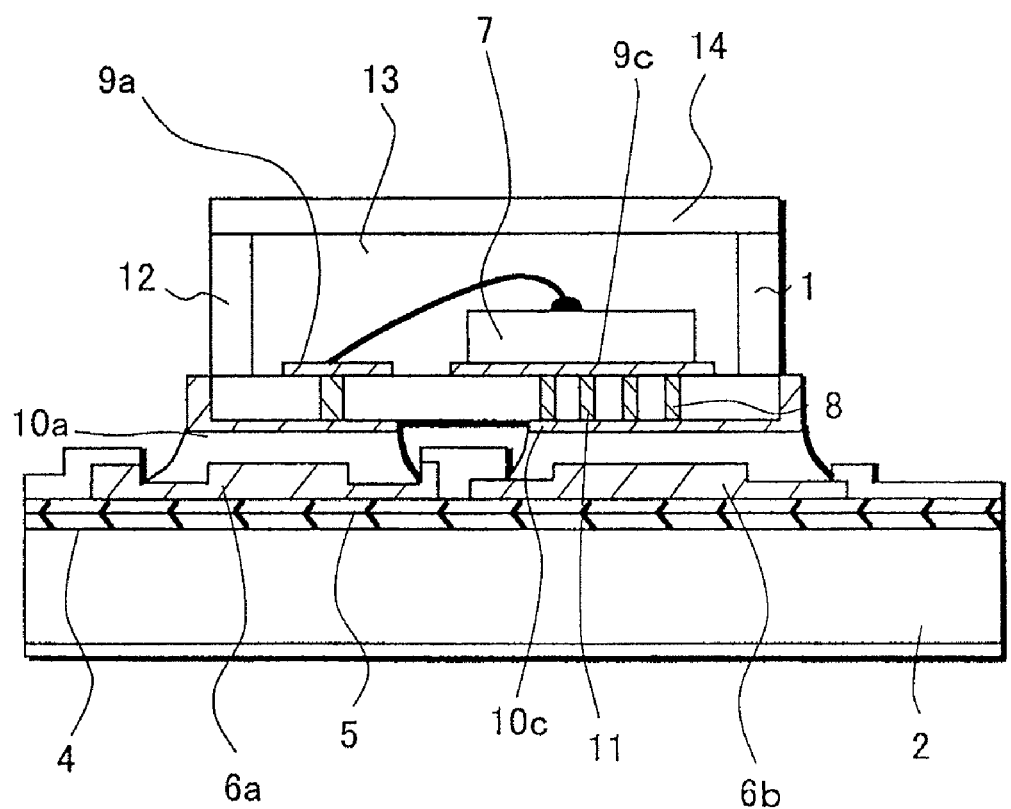
FIG. 6 is a view illustrating a method for manufacturing a lighting device.

FIG. 6 shows that the A electrode and the C electrode extend to the side wall of the ceramic substrate or the LED package.

Next, another embodiment will be explained. Although the former embodiment discusses about the angle of the side surface of the solder, a point after this is a slit. The metal substrate in this embodiment is similar to the former embodiments except for the structure of the slit.

FIG. 8A is a pattern diagram that shows the appearance where the LED package is arranged like the line on the metal substrate as well as FIG. 2(A).

The electrode and wiring corresponding to the equivalence circuit is formed on the metal substrate 2. In particular, the A electrode, the C electrode and the Rd electrode is formed in the LED package 1, as explained in FIG. 1(A), and in FIG. 8(C) the each sign 23a, 23b and 23c correspond to them, and LED package itself is illustrated by dotted line.

FIG. 8(B) is a drawing magnified a part of circle in FIG. 8(A) and depicts the conductive patterns disposed on the mounting region of one LED package. FIG. 8(C) is a cross-section drawing along the line X-Y and FIG. 8(D) is a cross-section drawing along the line X-X. The point of this embodiment is that the slit (ST) is formed between electrodes, and FIG. 8(E) typically shows that effect. As it is possible to analogize easily from the arrow in FIG. 8(E), the drawing shows that the stress caused from an expansion of the metal substrate 2 has been reduced by the slit.

In FIG. 8(B), there are a conductive pattern 23a which becomes a terminal and an A electrode at the bottom of space, and a conductive pattern 23b which becomes a C electrode at the top of space, and an island shaped conductive pattern 23c of a Rd electrode is disposed therebetween. Although the A electrode and the C electrode is electrically connected to the electrode of the another LED package, which is located on the upper side through the wiring, the Rd electrode 23c is floating and described as island because the electrode 23c is employed for releasing a heat. In addition, the wiring extends along the periphery of the metal substrate as shown with dotted line.

A feature of this embodiment is that the slit (ST) is disposed between the A electrode 23a and the Rd electrode 23c, between the C electrode 23b and the Rd electrode 23c or in both.

Figure 1C:
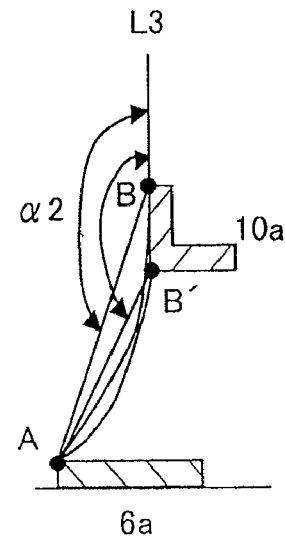

When the Rd electrode 23c is omitted, the slit (ST) will be disposed between the A electrode and C electrode. However, there is a following problem because this slit (ST) is formed with punching. Since LED package itself is small, the formation region of the slit (ST) is very narrow, so that for example the slit of about 0.3 cm in width and about 1 mm in length should be disposed. Furthermore, as explained in FIG. 1, inorganic insulation film consisting of an alumite is disposed on the surface of the metal substrate, and since the insulation film 5 comprises filler such as silica or alumina, there is a problem that the surface of the metal substrate is solid. In particular, because the opening area of the slit (ST) is elongate as shown in figure, the metal mold of the punch (blade) is also elongate. As a result, the metal mold galls heavily. This embodiment employs a manufacturing method of a substrate shown since FIG. 9 to solve this problem.

Figure 9A:
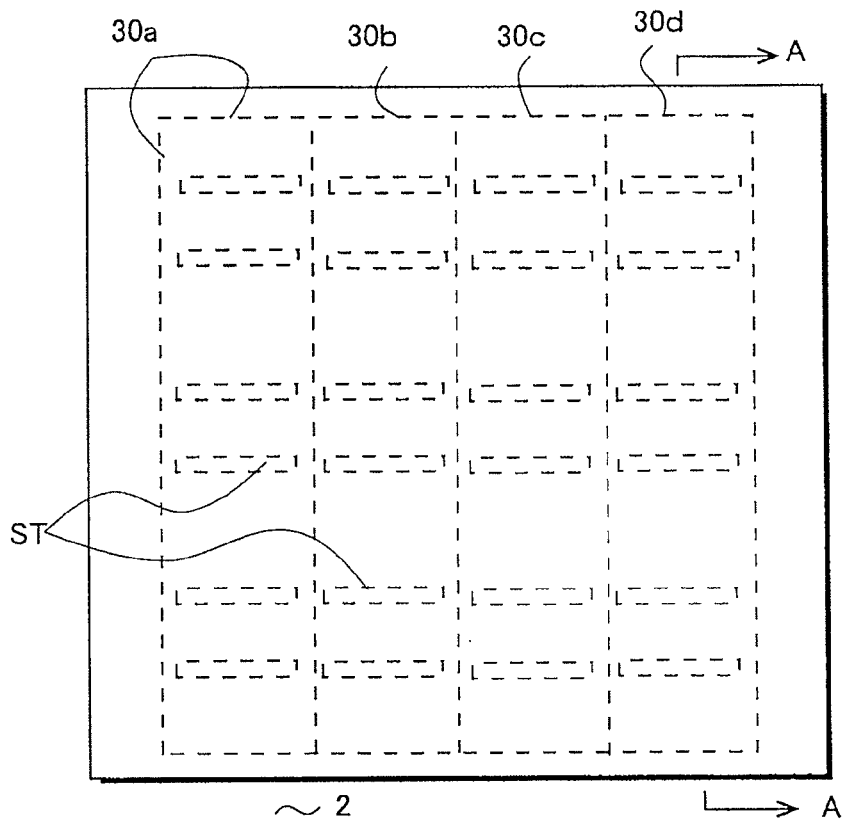
FIG. 9 is a view illustrating a method for manufacturing a lighting device.
Figure 9B:
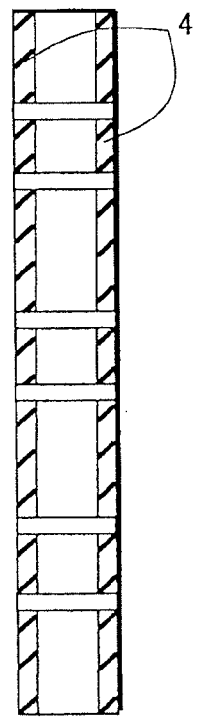

This method solves the problem by forming the slit (ST) before forming the insulation film 5. That is, it prevents the metal mold from galling by the filler of the insulation film. Also, the metal substrate 2 comprising of Al has two types, as shown in FIG. 9, one type is that the inorganic insulation film is formed on both surface of the Al substrate and the other type is that the inorganic insulation film is not formed. The latter type is easily damaged on the back surface of the metal substrate 2, and if the inorganic insulation film is formed on the metal substrate, the metal substrate is not easily damaged.

Then, this embodiment will be concretely explained. First, as shown in FIG. 9, a large-sized metal substrate 2 is prepared. As previously mentioned, a top surface and bottom surface of the metal substrate 2 is either a type that the whole surface of Al is exposed or a type that the both side of the metal substrate is covered by the inorganic insulation film. In both case, the area where the slit will be formed is punched at these conditions and the metal substrate 2 is punched out from the top surface to the back surface of the metal substrate. A portion shown with the dotted line 30a is an area where LED package 22 is disposed, and finally the area is separated along the line. The area 30a, 30b, 30c and 30d are formed collaterally. Small squares illustrated in the area 30a, 30b, 30c and 30d indicate an area where the silt was formed.

Figure 9C:
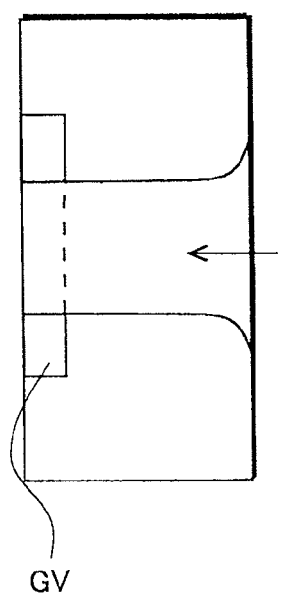

As shown in FIG. 9(C), the metal substrate may be punched two times. That is, a shallow groove is formed by pressing the top surface of the metal substrate lightly and shallowly at an area that is larger than an area corresponding to the slit ST on the metal substrate 2, and then the slit ST is formed by punching the area corresponding to the slit ST such that the slit penetrates from the back surface to the top surface of the metal substrate. In this way, a burr does not occur at the back surface of the metal substrate and chassis and heat release fin can be placed in contact with the back surface with no space between. In addition, although the burr occurs at the top surface, the burr is covered by the shallow groove and does not stick out of the insulation film 5. A short of wiring due to the burr can be prevented.

Following this, as shown in FIG. 10, the insulation film 5 including the filler and Cu foil 31 are affixed on the top surface of the metal substrate 2. Here, a sheet having the insulation film 5 disposed on the back surface of the large size Cu foil 31 is provided, and the sheet is affixed on the top surface of the metal substrate 2 by thermo compression bonding. The sheet can stay on the slit ST because the size of the slit ST is small and the insulation film 5 has a low liquidity even if the insulation film melts.

Following this, as shown in FIG. 11, the Cu foil 31 is patterned. This patterning is formed by applying a photoresist on the Cu foil, removing a part of the photoresist other than a region where the conductive pattern is formed and etching the exposed Cu foil with an etchant such as ferric chloride. The conductive pattern comprise at least the A electrode 23a, the C electrode 23b and the Rd electrode 23c, and the wiring and the terminals is formed depending on necessity. Under such a state, a part of the Cu foil corresponding to the slit ST is removed, but the slit ST is covered by the insulation film 5.

Figures 12A, 12B:
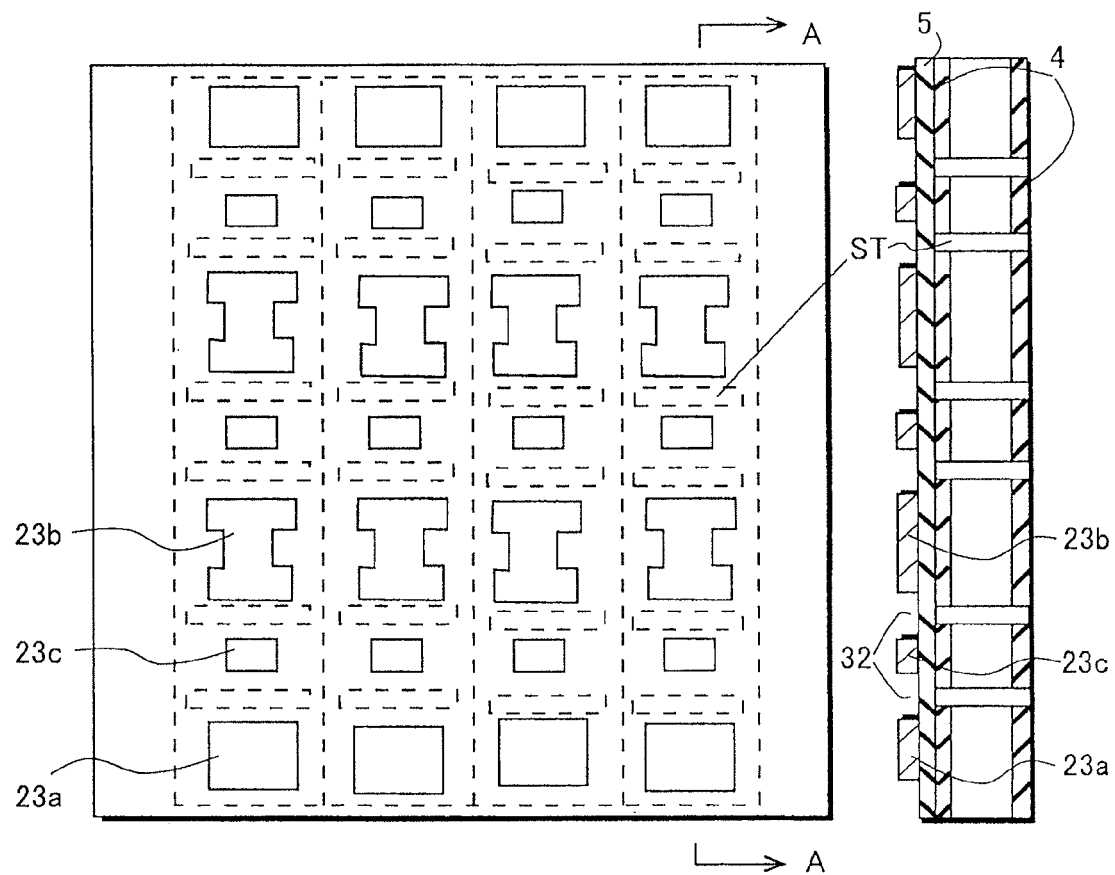
FIG. 12 is a view illustrating a method for manufacturing a lighting device.

Also, as shown in FIG. 12(B), a part of the insulation film 5 corresponding to the slit ST may be removed. It is shown by sigh 32 in FIG. 12 (B). Depending on the material of the insulation film, the kind of the filler and mixing rates of impurities, the insulation film might be brittle. In that case, the insulation film may be removed positively. In addition, when the insulation film is removed, it is removed by etching or laser in size slightly larger than the slit as shown in figure. In case of laser, only the insulation film with the filler can be removed by the effect of the ablation. By removing the insulation film, the microscopic burr of the slit occurs easily, which leads to release the stress. Further, it becomes possible to remove the burr through the removed region 32. The burr can be removed by the water washing or etching.

In FIG. 12(B), it might cause the short that the top surface of Al formed by punching from the removed region is exposed. However, if the insulation film is left without forming the removed region, this problem will not occur.

Finally, as shown in FIG. 13, there are processes that LED packages are mounted and LED bar is separated from the substrate. There are mainly two methods.

One method is that LED packages 20 are mounted on the metal substrate having large size and then LED bar 20 is separated as shown in FIGS. 13 (A) and (B). The other method is that the metal substrate is separated as a metal substrate for LED bar along the dotted line and then LED packages are mounted on the separated metal substrate as shown in FIGS. 13(D) and (E).

Figure 13A:
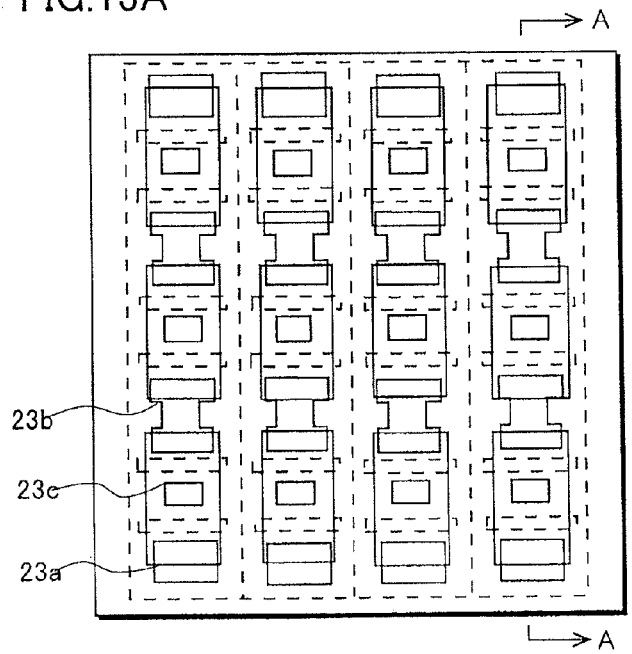
FIG. 13 is a view illustrating a method for manufacturing a lighting device.
Figure 13B:
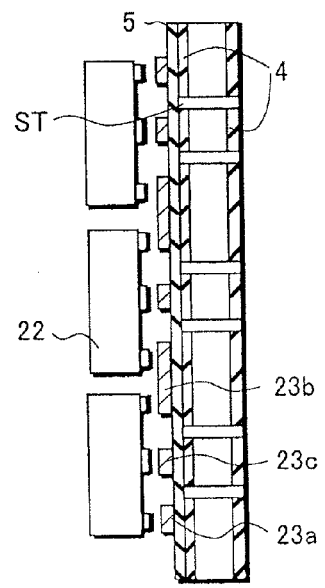
Figure 13C:
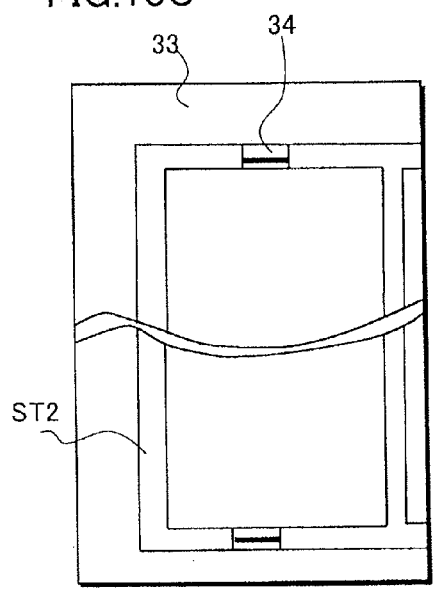
Figure 13D:
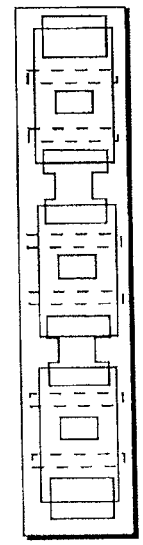
Figure 13E:
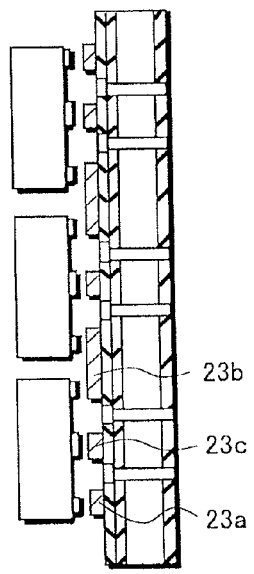
Figure 15:
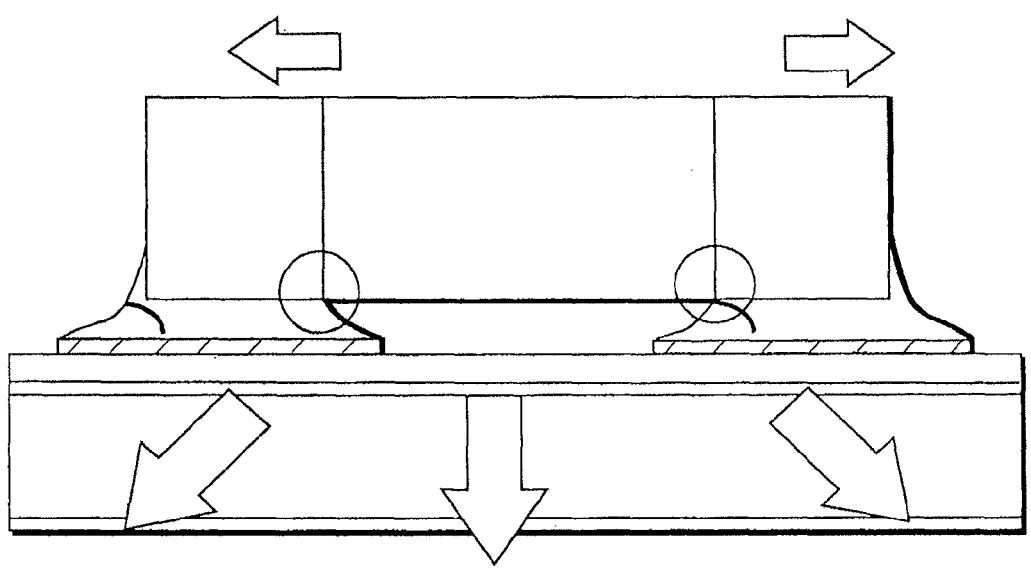
FIG. 15 is a view illustrating a lighting device of the conventional art.
Figure 16:
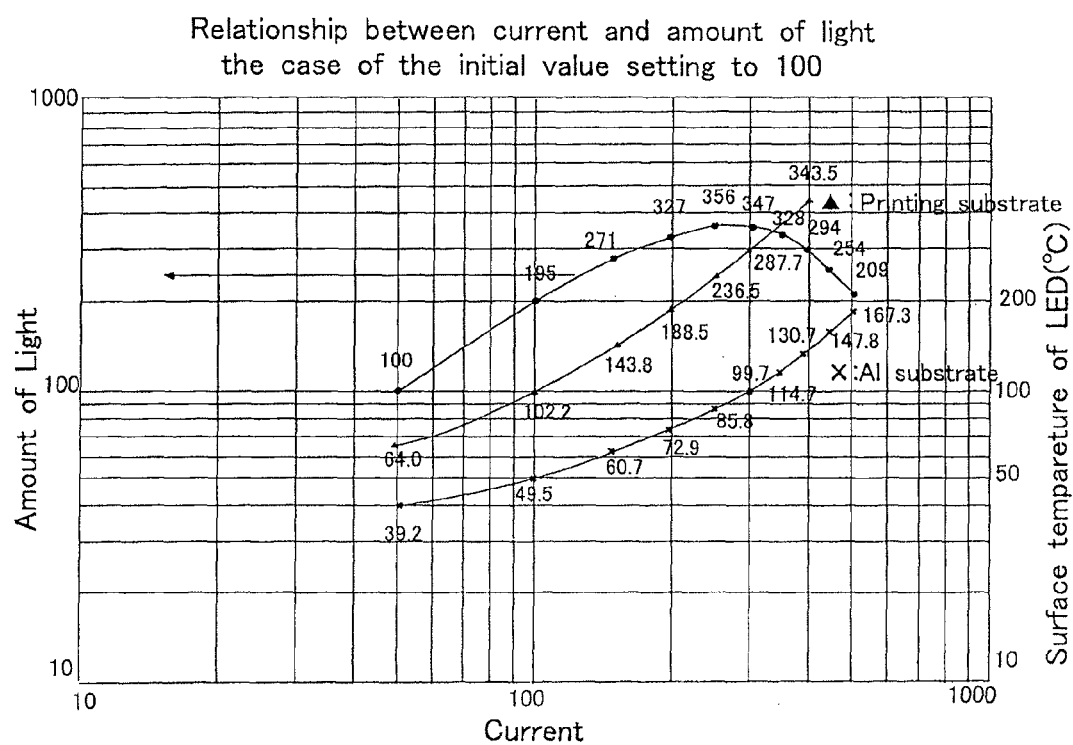
FIG. 16 is a view illustrating a relationship between a current and an amount of light, and between a current and a surface temperature of LED in the case of mounting LED on the Al substrate and the printing substrate.

As shown in FIG. 13(C), if the slit ST2 is disposed at the boundary of the LED bars 20 and a thin connection body 34 maintains the connection between the peripheral frame 33 and the LED bar, the LED bar is separated easily after mounting.

Finally, a type that an electrode is formed on the back surface of the LED chip will be explained with using FIG. 14. This type is that an anode (or a cathode) is formed on the top surface of the LED chip and a cathode (or an anode) is formed on the back surface of it. FIG. 14(B) briefly shows a structure of such LED package.

In this case, the anode electrode (or cathode electrode) and the cathode electrode (or anode electrode) corresponding to the aforementioned electrode are formed on the top surface and the back surface of the ceramic substrate. In particular, a thorough hole via formed on the cathode electrode (or anode electrode) becomes a thermal via for releasing a heat. Because the back surface of the chip works as an electrode, a thin metallic wire formed in a hollow portion of the package is enough by one.

In this case, a first electrode and a second electrode is formed corresponding to the anode (or cathode) electrode and the cathode (or anode) electrode, and the slit which is a point of this invention is formed between the first and second electrode.

Here, only the structure of the LED package is different from the former embodiments, and the structure of the metal substrate side can be applied to the former embodiment. The different point is that the cathode electrode doubles as the heat release electrode and a number of electrodes decrease by one, and as a result the slit is just formed between the first and second electrode of the metal substrate.

What is claimed is:

1. A lighting device comprising:
a metal substrate comprising aluminum;
a plurality of LED packages mounted on a top surface of the metal substrate, each package comprising a ceramic substrate, a LED chip mounted on a front surface of the ceramic substrate, an anode electrode, a cathode electrode and a heat release electrode, and the anode, cathode and heat release electrodes being disposed on a back surface of the ceramic substrate, a resin insulation film disposed on the top surface of the metal substrate so as to be between the LED packages and the top surface; and
a first electrode, a second electrode and a third electrode which are disposed on the insulation film, wherein the first, second and third electrodes are bonded to the anode, cathode and heat release electrodes, respectively;
wherein a shallow groove is formed in the first electrode or the second electrode; and
wherein the shallow groove extends from the inside toward the outside of the first electrode, or from the inside toward the outside of the second electrode in a plane view.

2. The lighting device according to claim 1, wherein the metal substrate has an elongated shape, and the LED packages are disposed along a long side of the metal substrate.

3. The lighting device according to claim 1, wherein the heat release electrode is smaller than the third electrode, and the anode electrode does not overlap completely the first electrode, or the cathode electrode does not overlap completely the second electrode.

4. The lighting device according to claim 1, wherein a wiring is disposed on the metal substrate, and the plurality of the LED packages are electrically connected in series along a long side of the metal substrate.

5. The lighting device according to claim 1, wherein the cathode electrode and the heat release electrode are the same electrode.

6. The lighting device according to claim 1, wherein a thickness of the heat release electrode is thicker than the anode electrode or the cathode electrode.

7. A lighting device comprising:
a metal substrate comprising aluminum;
a plurality of LED packages mounted on a top surface of the metal substrate, each package comprising a ceramic substrate, a LED chip mounted on a front surface of the ceramic substrate, an anode electrode and a cathode electrode, and the anode and cathode electrodes being disposed on a back surface of the ceramic substrate, a resin insulation film disposed on the top surface of the metal substrate so as to be between the LED packages and the top surface; and a first electrode and a second electrode which are disposed on the insulation film, wherein the first and second electrodes are bonded to the anode, and cathode electrodes, respectively, and a slit is formed in the metal substrate between two neighboring anode and cathode electrodes;

wherein a heat release electrode which releases a heat of the LED chip is disposed between the neighboring anode and cathode electrode, and the slit is disposed between the anode electrode and the heat release electrode, or between the cathode electrode and the heat release electrode.

8. The lighting device according to claim 7, wherein a wiring is disposed on the metal substrate, and the LED packages are electrically connected in series along a long side of the metal substrate.

9. The lighting device according to claim 7, wherein the anode electrode or the cathode electrode doubles as a heat release electrode which releases a heat of the LED chip, and a via hole formed in the ceramic substrate doubles as a thermal via and a through hole via.

* * * * *